United States Patent
Murata et al.

(10) Patent No.: US 11,906,569 B2
(45) Date of Patent: Feb. 20, 2024

(54) SEMICONDUCTOR WAFER EVALUATION APPARATUS AND SEMICONDUCTOR WAFER MANUFACTURING METHOD

(71) Applicant: SHOWA DENKO K.K., Tokyo (JP)

(72) Inventors: Koichi Murata, Yokosuka (JP); Isaho Kamata, Yokosuka (JP); Hidekazu Tsuchida, Yokosuka (JP); Akira Miyasaka, Chickibu (JP)

(73) Assignee: SHOWA DENKO K.K., Tokyo (JP)

( * ) Notice: Subject to any disclaimer, the term of this patent is extended or adjusted under 35 U.S.C. 154(b) by 156 days.

(21) Appl. No.: 17/519,679

(22) Filed: Nov. 5, 2021

(65) Prior Publication Data
US 2022/0146564 A1  May 12, 2022

(30) Foreign Application Priority Data
Nov. 6, 2020 (JP) .................. 2020-185713

(51) Int. Cl.
| | |
|---|---|
| *G01R 1/06* | (2006.01) |
| *G01R 31/26* | (2020.01) |
| *H01L 21/66* | (2006.01) |
| *G01R 1/067* | (2006.01) |
| *C30B 29/36* | (2006.01) |
| *C23C 16/32* | (2006.01) |
| *C23C 16/52* | (2006.01) |

(Continued)

(52) U.S. Cl.
CPC ........ *G01R 31/2601* (2013.01); *C23C 16/325* (2013.01); *C23C 16/52* (2013.01); *C30B 25/16* (2013.01); *C30B 29/36* (2013.01); *G01R 1/06783* (2013.01); *G01R 31/2648* (2013.01); *G01R 31/2656* (2013.01); *H01L 22/20* (2013.01); *C30B 35/00* (2013.01)

(58) Field of Classification Search
CPC ....... C23C 16/32; C23C 16/52; C23C 16/325; C30B 25/16; C30B 29/36; C30B 35/00; G01R 1/067; G01R 31/26; G01R 31/265; G01R 1/06783; G01R 31/2601; G01R 31/2648; G01R 31/2656; H01L 21/66; H01L 22/12; H01L 22/20
USPC ....................................... 324/71.4
See application file for complete search history.

(56) References Cited

U.S. PATENT DOCUMENTS

| | | | | |
|---|---|---|---|---|
| 3,794,912 A | * | 2/1974 | Severin ............... | G01N 27/041 324/754.04 |
| 2016/0086799 A1 | * | 3/2016 | Hiyoshi ............... | H01L 29/32 257/77 |
| 2017/0160335 A1 | * | 6/2017 | Aratani ............... | H01L 22/14 |

FOREIGN PATENT DOCUMENTS

| | | | | |
|---|---|---|---|---|
| JP | 2007318031 A | * | 12/2007 | .......... H01L 21/336 |
| JP | 2016-100591 A |   | 5/2016 | |

OTHER PUBLICATIONS

Espacenet English translation of JP2007318031A Manufacturing Method of Silicon Carbide Semiconductor Element (Year: 2007).*

* cited by examiner

*Primary Examiner* — Jermele M Hollington
*Assistant Examiner* — Courtney G McDonnough
(74) *Attorney, Agent, or Firm* — Sughrue Mion, PLLC

(57) ABSTRACT

A semiconductor wafer evaluation apparatus brings a contact maker (mercury liquefied at room temperature), as a Schottky electrode, into contact with a semiconductor wafer, intermittently applies a voltage from a pulse power supply, and evaluates the state (kinds, density) of point defects by an evaluation means based on the status of the electrostatic capacity of the semiconductor wafer. In this manner, the state (kinds, density) of the point defects in the plane of a (Continued)

large-diameter semiconductor wafer is directly evaluated using a large table.

15 Claims, 5 Drawing Sheets

(51) Int. Cl.
  *C30B 25/16* (2006.01)
  *G01R 31/265* (2006.01)
  *C30B 35/00* (2006.01)

SEMICONDUCTOR WAFER EVALUATION APPARATUS AND SEMICONDUCTOR WAFER MANUFACTURING METHOD

The entire disclosure of Japanese Patent Application No. 2020-185713 filed on Nov. 6, 2020 is expressly incorporated by reference herein.

TECHNICAL FIELD

This invention relates to an apparatus for evaluating crystal defects in a semiconductor wafer, the apparatus capable of unerringly evaluating the status of the crystal defects (point defects) in the plane of the semiconductor wafer; and a method for manufacturing a semiconductor wafer.

BACKGROUND ART

In recent years, upgraded performance has been required of a power semiconductor device which withstands a high voltage and controls a high current. For this purpose, the application of a new material (e.g., silicon carbide, gallium nitride, gallium oxide, or diamond) is under consideration in addition to a silicon (Si) single crystal of a conventional type. As a technology for evaluating crystal defects of a semiconductor device, for example, a technology for evaluation of device characteristics by current application of the device is known (Patent Document 1).

To ensure the performance of the power semiconductor device and secure its reliability, it is required to inspect that the resulting semiconductor device functions as designed; ascertain that the quality of a semiconductor crystal, a raw material, has been improved; detect crystal defects present in the crystal; and grasp its characteristics properly.

Conventionally, the power semiconductor device has been formed using a semiconductor wafer having an epitaxial layer grown on a single crystal substrate. After the quality of the semiconductor wafer (epiwafer) is confirmed, therefore, the power semiconductor device is required to be used. The locations, kinds and density of crystal defects (extended defects) present in the semiconductor wafer are determined by a widely used evaluation method utilizing an optical technique.

A doping concentration, one of the characteristics of the semiconductor wafer, can be estimated by forming a Schottky junction and determining the capacitance-voltage characteristics. A mercury electrode may be used as a convenient method capable of omitting a process for forming a Schottky electrode.

Crystal defects (point defects) influencing the characteristics of the semiconductor wafer, however, are merely evaluated indirectly from characteristics affected by their defect density (i.e., carrier lifetime). According to the existing method used for evaluation of the point defect density, it is necessary to cut some sample out of the semiconductor wafer, stack a Schottky electrode thereon, then perform current application, and make evaluation based on the results. This type of method is difficult to apply to a large-diameter semiconductor wafer.

The existing method of evaluation, therefore, has been unsuitable for evaluation at the time of mass production.

PRIOR ART DOCUMENTS

Patent Documents

[Patent Document 1] JP-A-2016-100591

SUMMARY OF THE INVENTION

Problems to be Solved by the Invention

The present invention has been accomplished in the light of the above-described circumstances. It is an object of this invention to provide a semiconductor wafer evaluation apparatus which can easily evaluate crystal defects in the entire surface of a semiconductor wafer; and a semiconductor wafer manufacturing method using the semiconductor wafer evaluation apparatus.

Means for Solving the Problems

A semiconductor wafer evaluation apparatus according to a first aspect of the present invention for attaining the above object comprises: a contact maker where a metal (Schottky electrode) liquefied at room temperature makes contact with a semiconductor wafer as an object to be evaluated; a power supply means for applying a voltage to the contact maker via a means for compensating for parasitic inductance and parasitic capacity; an application control means for intermittently establishing the applied state of the voltage from the power supply means; and an evaluation means for evaluating the state of point defects of the semiconductor wafer based on the status of the electrostatic capacity of the semiconductor wafer during intermittent application of the voltage by the application control means.

According to the first aspect of the invention, with the contact maker (mercury) in contact with the semiconductor wafer, voltage is intermittently applied, and the state (kinds, density) of the point defects is evaluated based on the status of the electrostatic capacity of the semiconductor wafer. Since the metal (mercury) to be liquefied at room temperature is used as the Schottky electrode, there is no need to cut out the semiconductor wafer partially and stack a metal electrode. The point defects in the entire semiconductor wafer can be evaluated directly, and their evaluation can be made easily. As the means for compensating for the parasitic inductance and the parasitic capacity, for example, it is possible to employ a means utilizing offset adjustment which adjusts errors before measurement to zero.

As noted above, the crystal defects of the semiconductor wafer can be evaluated easily and, for example, the carrier lifetime of the semiconductor wafer can be evaluated indirectly.

A semiconductor wafer evaluation apparatus according to a second aspect of the present invention is the semiconductor wafer evaluation apparatus according to the first aspect of the invention, wherein the metal liquefied at room temperature is mercury.

According to the second aspect of the invention, mercury can be used as a Schottky electrode.

A semiconductor wafer evaluation apparatus according to a third aspect of the present invention is the semiconductor wafer evaluation apparatus according to the second aspect of the invention, wherein the point defects are defects whose signals peak at a temperature near room temperature, and the state of the point defects is the kinds and density of the point defects.

According to the third aspect of the invention, the kinds and density of the point defects whose signals peak at around room temperature can be evaluated.

A semiconductor wafer evaluation apparatus according to a fourth aspect of the present invention is the semiconductor wafer evaluation apparatus according to any one of the first to third aspects of the invention, which further comprises a moving means for moving the contact maker relatively in the range of a diameter of 150 mm or more with respect to the planar direction of the semiconductor wafer.

According to the fourth aspect of the invention, the contact maker is moved, in the range of a diameter of 150 mm or more, to any position in the plane of the semiconductor wafer, so that even in the upsized semiconductor wafer, the in-plane distribution of the point defects in the entire surface of the semiconductor wafer can be grasped.

A semiconductor wafer evaluation apparatus according to a fifth aspect of the present invention is the semiconductor wafer evaluation apparatus according to any one of the first to fourth aspects of the invention, wherein the application control means has the function of varying the applied voltage, and the evaluation means evaluates the state of the point defects at a deep location in a depth direction when the applied voltage is varied.

According to the fifth aspect of the invention, the applied voltage is varied (raised), whereby the state of the point defects at a deep location in the depth direction of the semiconductor wafer can be evaluated.

A semiconductor wafer evaluation apparatus according to a sixth aspect of the present invention is the semiconductor wafer evaluation apparatus according to any one of the first to fifth aspects of the invention, which further comprises a photoirradiation means for performing irradiation with light having energy equal to or higher than the bandgap of the semiconductor wafer, and wherein the evaluation means evaluates the defects by minority carrier transient spectroscopy.

According to the sixth aspect of the invention, light having energy equal to or more than the bandgap is projected by the photoirradiation means, whereby the defects can be evaluated by minority carrier transient spectroscopy.

A semiconductor wafer evaluation apparatus according to a seventh aspect of the present invention is the semiconductor wafer evaluation apparatus according to any one of the first to sixth aspects of the invention, wherein the semiconductor wafer is a SiC single crystal. A semiconductor wafer evaluation apparatus according to an eighth aspect of the present invention is the semiconductor wafer evaluation apparatus according to the seventh aspect of the invention, wherein the point defects in the SiC single crystal are $Z_{1/2}$ centers ascribed to carbon vacancies.

A semiconductor wafer manufacturing method according to a ninth aspect of the present invention, intended to attain the aforementioned object, comprises adjusting and controlling conditions for thin film formation by a semiconductor manufacturing means based on information on the point defects, which has been obtained using the semiconductor wafer evaluation apparatus according to any one of the first to eighth aspects of the invention, thereby manufacturing a semiconductor wafer.

According to the ninth aspect of the invention, a semiconductor wafer can be manufactured, with its crystal defects being evaluated to maintain its quality in a desired state.

As noted above, a semiconductor wafer can be manufactured, with its crystal defects being evaluated easily. For example, the semiconductor wafer can be manufactured, with its carrier lifetime being evaluated.

Effects of the Invention

The semiconductor wafer evaluation apparatus of the present invention is capable of evaluating the crystal defects of a semiconductor wafer with ease and in a nondestructive manner.

The semiconductor wafer manufacturing method of the present invention is capable of manufacturing a semiconductor wafer upon easy and nondestructive evaluation of the crystal defects of the semiconductor wafer.

Since nondestructive evaluation can be made, the product itself can be inspected.

MODE FOR CARRYING OUT THE INVENTION

A semiconductor wafer evaluation apparatus according to one embodiment of the present invention will be described based on FIGS. 1 to 3.

Figure 1:
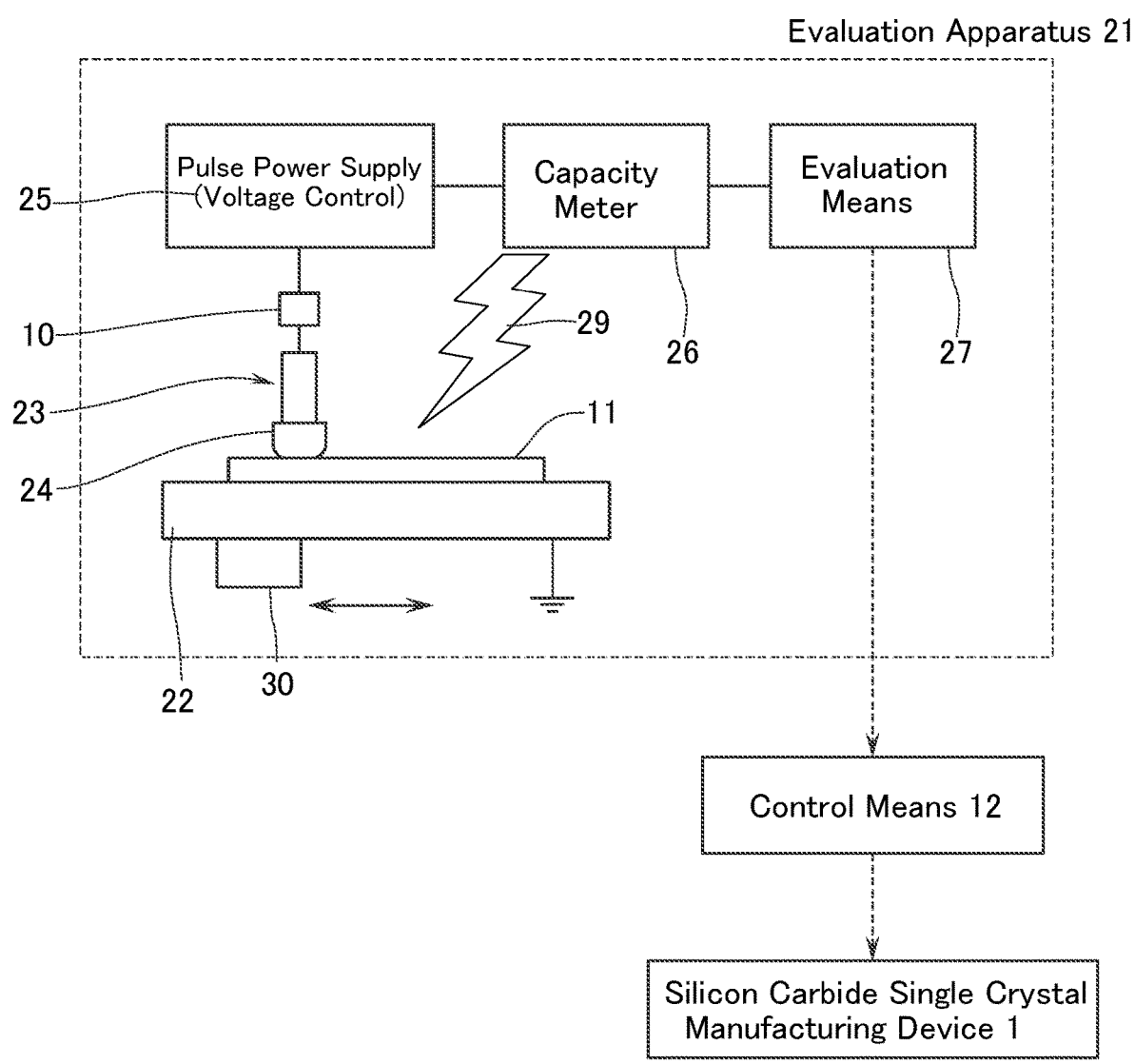
FIG. 1 is a schematic configuration diagram of a semiconductor wafer evaluation apparatus according to an embodiment of the present invention.
Figure 2:
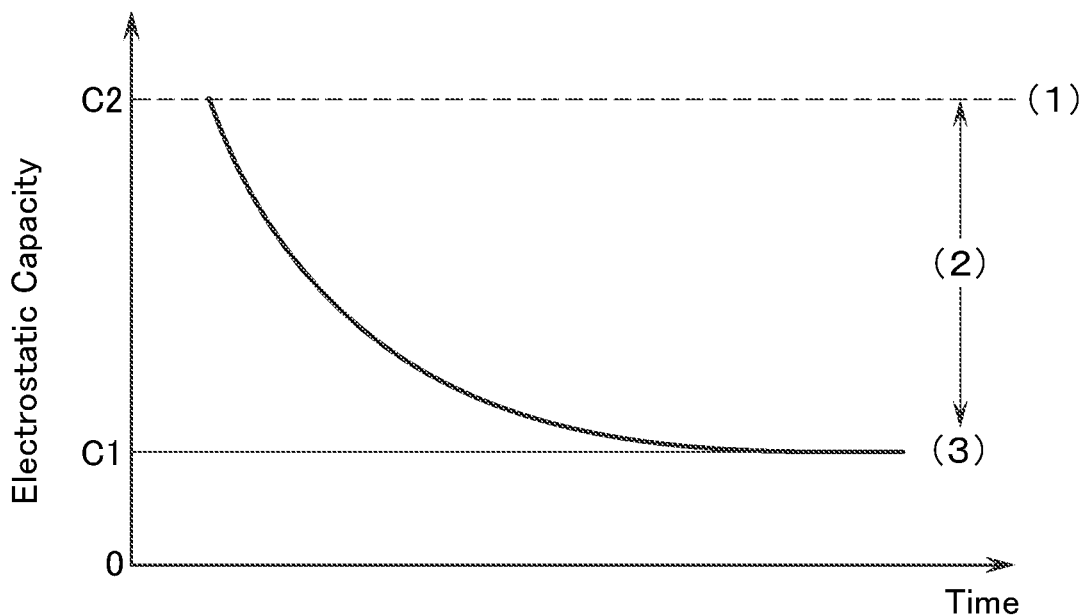
FIG. 2 is a graph showing the time course of electrostatic capacity.

FIG. 1 shows the schematic configuration of an evaluation apparatus 21 which is the semiconductor wafer evaluation apparatus according to the one embodiment of the present invention. FIG. 2 shows a graph representing the time course of electrostatic capacity. FIG. 3 shows the attenuation curve of the electrostatic capacity at the peak of point defects (for example, $Z_{1/2}$ center defects in a SiC single crystal). FIG. 4 shows a graph representing a temperature sweep spectrum indicating the relation between signal intensity due to the point defects and a temperature. The $Z_{1/2}$ center is ascribed to a carbon vacancy.

As shown in FIG. 1, the evaluation apparatus 21 is equipped with a table 22 on which a semiconductor wafer 11, an object to be evaluated, is placed, and which is supported so as to be reciprocatable in a plane. A probe means 23 as a means of contact is provided which contacts the semiconductor wafer 11 placed on the table 22 and which can reciprocate in the plane in a direction perpendicular to the table 22.

The probe means 23 is structured to bring mercury (Schottky electrode), which is liquefied at room temperature, as a contact maker 24 into contact with the semiconductor wafer 11. The probe means 23 is rendered movable, owing to the reciprocation of the table 22 and the probe means 23 itself, to any position in the plane of the semiconductor wafer 11.

The evaluation apparatus 21 may be equipped with a moving means 30. In FIG. 1, the moving means 30 is connected to the table 22. The moving means 30 may be connected to the probe means 23. The moving means is, for example, a motor. The moving means 30 may be a manually movable dial, screw or the like. The moving means 30 moves the contact maker relatively with respect to the planar direction of the semiconductor wafer.

The probe means 23 can move the contact maker to any position in the plane of the semiconductor wafer 11, for example, within the range of the semiconductor wafer 11 with a diameter of 150 mm or more, preferably, 300 mm or more. Thus, even in the case of the semiconductor wafer 11 having a large diameter, the in-plane distribution of point defects in the entire semiconductor wafer 11 can be grasped.

A pulse power supply 25, as a power supply means, is provided which applies a voltage to the contact maker 24 (mercury) of the probe means 23 via a means 10 for compensating for parasitic inductance and parasitic capacity. The pulse power supply 25 has the function of intermittently bringing the state of voltage application (application control means). The evaluation apparatus 21 is equipped with a capacity meter 26 for measuring the electrostatic capacity of the semiconductor wafer 11 when the voltage is intermittently applied by the pulse power supply 25.

The time course of the electrostatic capacity of the semiconductor wafer 11 will be described based on FIG. 2.

When a voltage is applied from a steady-state voltage (3) to the semiconductor wafer 11 (1), electrons are trapped in an n-type semiconductor, or holes are trapped in a p-type semiconductor, at the trap level of point defects. That is, the electrostatic capacity of the semiconductor wafer 11 changes from C1 to C2. Upon stoppage of the voltage application, the trapped electrons or holes are released, leading to positive or negative charging. A depletion layer expands so as to cancel the resulting charges (2). Finally, in the state of the steady-state voltage, the electrostatic capacity of the semiconductor wafer 11 changes to C1 (3).

By the application of the pulsed voltage, the electrostatic capacity changes over time from C2 (1) to C1 (3) through the process of (2). Based on these changes in the electrostatic capacity with the passage of time (values of the electrostatic capacity after a lapse of a predetermined time), the trap level and density of the point defects can be confirmed. Concretely, in (1) where the voltage has been applied, the density of the electrons or holes trapped corresponds to the density of the point defects. Thus, the changes in the electrostatic capacity are proportional to the density of the point defects approximately.

The above-described evaluation apparatus 21, therefore, makes it possible to evaluate easily the density of point defects which are crystal defects of the semiconductor wafer 11.

Figure 3:
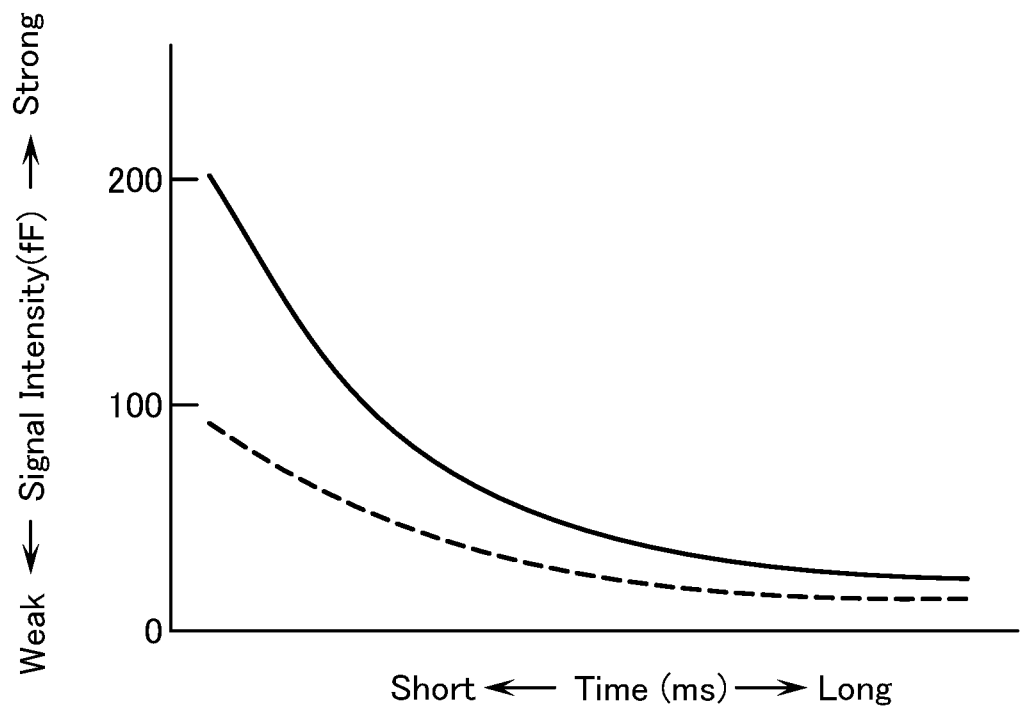
FIG. 3 is a graph showing the attenuation status of the electrostatic capacity at the peak of point defects.
Figure 4:
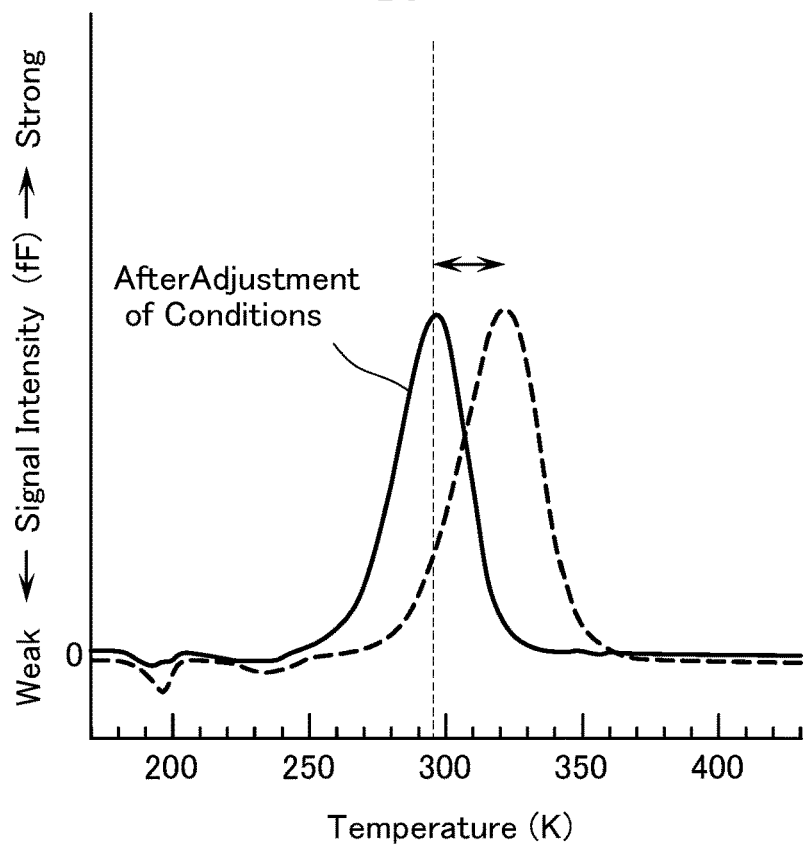
FIG. 4 is a graph showing the relation between signal intensity due to the point defects and a temperature.

As shown in FIG. 3, the attenuation status of the electrostatic capacity of the point defect (carbon vacancy defect) peak in the silicon carbide semiconductor wafer has been confirmed. That is, the following findings have been obtained: If the point defects (carbon vacancy defects) are large (indicated by a solid line), the signal intensity for detection of the electrostatic capacity lowers with the passage of time. If the point defects (carbon vacancy defects) are small (indicated by a dashed line), with the absolute value of the signal intensity being lower than the case where the point defects are large, the signal intensity for detection of the electrostatic capacity declines over time (i.e., the attenuation of the electrostatic capacity has been confirmed).

By reference to FIG. 1 again, the status of the electrostatic capacity measured by the capacity meter 26 is sent to an evaluation means 27. In the evaluation means 27, the state (kinds, density, etc.) of the point defects of the semiconductor wafer 11 is evaluated based on the status of the electrostatic capacity of the semiconductor wafer 11. As an example of making the evaluation, the attenuation curve of the electrostatic capacity is approximated by an exponential function (Napier's constant is the base) to determine the amount of change in the signal intensity, and the defect density can be calculated using the value of the doping density that has been determined beforehand. A time constant is calculated from the exponent of the exponential function to evaluate an energetic depth in the bandgap of the defects. Concretely, provided that the trap density is Nt, and the doping density is N, Nt is approximately calculated as $2N \times |C2-C1|/C1$. Nt may be multiplied by a correction term for correcting an error due to a nonionized region at the tip of the depletion layer.

The point defect is a defect whose signal peaks at a temperature in the vicinity of room temperature. It is measured concretely by utilization of a correlation function (correlator method). This method is applicable to a defect which can be adjusted so that an electrical signal peak is obtained at around room temperature. For example, the correlation function described in the literature Y. Tokuda, N. Shimizu, and A. Usami, Jpn. J. Appln. Phys. 18, 309 (1979) can be utilized.

As shown in FIG. 4, when an Ni-Schottky electrode is used, for example, the point defects, which have been observed with their peak appearing in a state higher than room temperature (the state indicated by a dashed line), can be observed in a state near room temperature (the state indicated by a solid line), by adjusting the measurement conditions (period of the correlation function). An example of the point defects at around room temperature is $Z_{1/2}$ center defects in the SiC single crystal.

By evaluating the signal intensity while varying the period of the correlation function beforehand, the period of the correlation function which enables the maximum value of the signal intensity to be obtained is determined. The optimal value of the period of the correlation function depends on the kind of the defect (energetic depth of the defect). In order to evaluate a plurality of defects, therefore, an appropriate value needs to be used for each of them.

Even if, at around room temperature, the signal intensity deviates slightly from the peak value, the relative value can be used for evaluation of the uniformity of the defect density in the wafer plane. However, the defect density will be undervalued and, in a region where the defect density is low, the values may be below the lower limit of detection.

Generally, an evaluation method involving measurements using a temperature sweep may be available in an attempt to evaluate unknown defects. In the present invention, there is no need to provide a massive cooling device or high-temperature heating device for adjusting the wafer temperature, and it suffices to annex a heater for temperature control to room temperature or a temperature close to room temperature. Thus, the cost of equipment can be kept low.

The pulse power supply 25 has the function of varying the applied voltage. By raising the applied voltage from the pulse power supply 25 (for example, to 100V), the state (kinds, density, etc.) of the point defects at a location deep in the depth direction of the semiconductor wafer 11 is evaluated in the evaluation means 27. By making measurements while varying the applied voltage, the depth profile of the state of the defects can be acquired.

The evaluation apparatus 21 can be configured to have a photoirradiation means 29 for performing irradiation with light having energy equal to or above the bandgap of the semiconductor wafer 11. By irradiation with light equal to or above the bandgap by the photoirradiation means 29, defects are evaluated by minority carrier transient spectroscopy in the evaluation means 27.

Without irradiation with light, in an n-type semiconductor, the evaluation apparatus can be applied to defects forming a defect level in a bandgap near a conduction band; in a p-type semiconductor, the evaluation apparatus can be applied to defects forming a defect level in a bandgap near a valence band. Upon irradiation with light, in an n-type semiconductor, the evaluation apparatus can be applied to defects forming a defect level in a bandgap near a valence band; in a p-type semiconductor, the evaluation apparatus can be applied to defects forming a defect level in a bandgap near a conduction band.

For example, the evaluation apparatus can also evaluate the status of B-related defects in an n-type SiC crystal. B defects are formed by B impurities unintentionally introduced during the crystal growth of SiC, and affect the doping density of the n-type SiC crystal. By evaluating the density of the B-related defects, the evaluation apparatus can be applied to the quality control of the wafer. As an example, the evaluation apparatus can be applied to evaluating the density of point defects called a D center which is composite defects composed of B defects and carbon vacancies. The evaluation apparatus is also applicable to the density evaluation of defects attributed to an unintentionally introduced transition metal element, in addition to B impurities.

The evaluation apparatus 21 of the foregoing configuration applies voltage intermittently, with the contact maker 24 (mercury) in contact with the semiconductor wafer 11, and can evaluate the status of point defects (kinds, density, etc.: e.g., carbon vacancy density in the SiC crystal) based on the status of the electrostatic capacity of the semiconductor wafer 11. Since the metal (mercury) liquefied at room temperature can be used as the Schottky electrode, it is unnecessary to cut out the semiconductor wafer 11 partly and stack a metal electrode for the purpose of evaluation. It becomes possible to evaluate the point defects of the entire semiconductor wafer directly.

The contact maker 24 (mercury) is moved relatively to any position in the plane of the semiconductor wafer 11, and voltage is applied intermittently, whereby the distribution of point defects (e.g., distribution of density, etc.) in the plane of the semiconductor wafer 11 can be evaluated.

Figure 5:
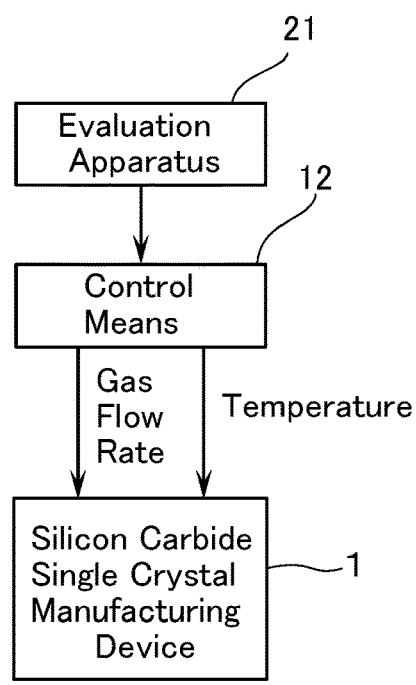
FIG. 5 is a conceptual diagram of a semiconductor manufacturing system having the semiconductor wafer evaluation apparatus according to the embodiment of the present invention.
Figure 6:
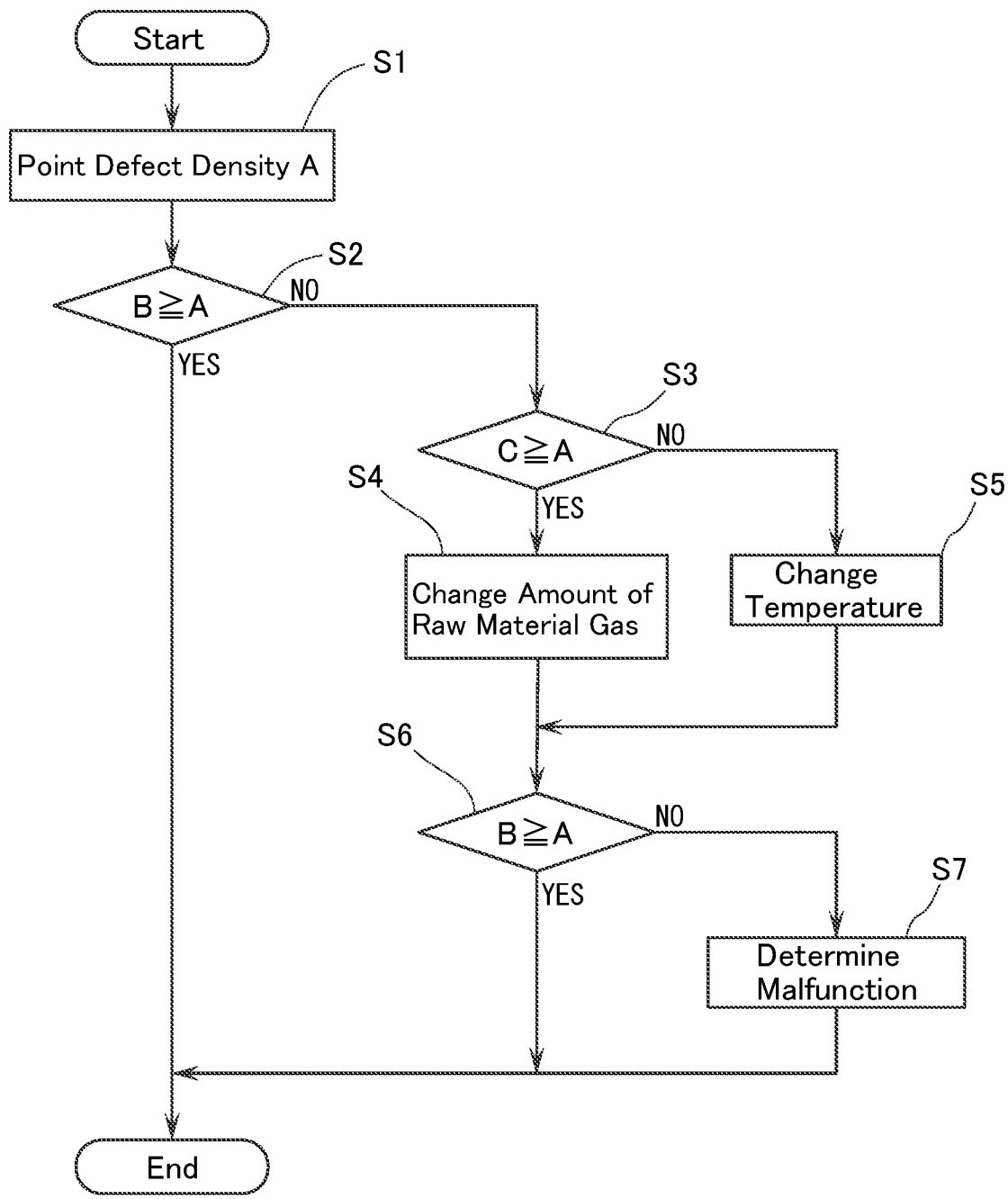
FIG. 6 is a flowchart illustrating an example of control actions of a semiconductor wafer manufacturing method according to the embodiment of the present invention.

Based on FIGS. 5 and 6, explanations will be offered for the outline of a semiconductor manufacturing system, and the status of the concrete flow of the evaluation of the carrier lifetime of the semiconductor wafer 11 (manufacturing method).

The following embodiment shows an example in which a silicon carbide semiconductor is applied as the semiconductor wafer 11. In this case, the density of carbon vacancies (carbon vacancy density) can be evaluated as point defects.

FIG. 5 shows the conceptual configuration of a semiconductor manufacturing system having the semiconductor wafer evaluation apparatus according to the one embodiment of the present invention. FIG. 6 is a flowchart illustrating an example of control actions by a control means 12.

As shown in FIG. 5, a silicon carbide single crystal manufacturing device 1, a semiconductor manufacturing means, epitaxially grows a silicon carbide single crystal (SiC single crystal) by chemical vapor deposition, for example. The silicon carbide single crystal manufacturing device 1 is a device equipped with a raw material gas supply device, a temperature control means, etc. A seed substrate is disposed on a susceptor, and a raw material gas is supplied to obtain a semiconductor wafer 11 having a SiC single crystal grown on the seed substrate.

The silicon carbide single crystal manufacturing device 1 is subject to control by the control means 12 over the pressure of the manufacturing device, the composition of the raw material gas supplied from the raw material gas supply device (C/Si ratio, addition rates of additives such as $N_2$, Al and B, and so on), the amount of the gas supplied, the supply position (supply angle) of the raw material gas, etc. The state of the susceptor (number of revolutions, position of rotation axis, etc.) is also adjusted by the control means 12. Furthermore, the temperature control means is controlled by the control means 12 and adjusted to a predetermined high temperature state.

In the silicon carbide single crystal manufacturing device 1, the conditions for growth of the SiC single crystal are adjusted in accordance with information from the evaluation apparatus 21, the semiconductor wafer evaluation apparatus of the present invention. In the evaluation apparatus 21, the state of point defects (kinds, density of the point defects) of an epitaxial film of the semiconductor wafer 11 is found. In the control means 12, the conditions for growth of the SiC single crystal (distribution of the point defects, etc.) by the silicon carbide single crystal manufacturing device 1 are adjusted and controlled in accordance with the results of evaluation by the evaluation apparatus 21.

If the desired performance fails to be achieved (desired conditions fail to be established) even upon adjustment and control of the conditions for growth of the SiC single crystal, the control means 12 can judge the silicon carbide single crystal manufacturing device 1 to be malfunctioning. As a result, maintenance of the silicon carbide single crystal manufacturing device 1, for example, can be put under management. Thus, the malfunction of the device can be grasped so as not to continue manufacturing products which do not achieve the desired performance.

Consequently, it becomes possible to maintain the quality of the semiconductor wafer 11 in a desired state by evaluating the state of the point defects (kinds, density of the point defects) of the epitaxial film of the semiconductor wafer 11.

The control means 12 determines, for example, carbon vacancy density, and controls the composition or the like of the raw material gas so that the carbon vacancy density determined will be in a desired state. By so doing, control can be exercised so that the carbon vacancy density is maintained in the desired state. If the carbon vacancy density fails to enter the desired state even upon control for maintaining the carbon vacancy density in the desired state, the control means 12 judges the silicon carbide single crystal manufacturing device 1 to be deficient, and can take a necessary measure.

The control means 12 also finds point defects related to the additives (related to impurities), and controls the flow rate of the raw material gas (doping gas) so that the density of the found point defects will be in a desired state. By so doing, the state of the impurities-related point defects can be maintained in the desired state.

As described above, the applied voltage from the pulse power supply 25 is raised to vary the measured voltage, thereby evaluating the state (kinds, density, etc.) of the point defects at a location deep in the depth direction of the semiconductor wafer 11. This way of evaluation combined with the control means makes it possible to control the characteristics in the depth direction of the epiwafer. By working out a process, moreover, a multi-layered epiwafer having characteristics changed in the depth direction can be prepared, and the state in the depth direction can be confirmed by the evaluation apparatus 21.

An example of concrete control (manufacturing method) will be described based on FIG. 6.

In Step S1, point defects (kinds, density of point defects: point defect density A) of the epitaxial film based on changes in the electrostatic capacity are read in. It is determined in Step S2 whether or not the read-in point defect density A is equal to or less than a target value B (threshold value). If, in Step S2, it is determined that the point defect density A is equal to or less than the target value B, the point defect density is taken to be in the desired state, and the program comes to an end. Thus, the manufacturing of the semiconductor wafer 11 is continued as such.

If, in Step S2, the point defect density A is judged to exceed the target value B, it is determined in Step S3 whether or not the point defect density A is equal to or less than a value C which is higher than the target value B. If, in Step S3, the point defect density A is judged to be equal to or less than the value C, the raw material gas supply device is controlled. In Step S4, the amount of the raw material gas, for example, is changed so that the C/Si ratio of the raw material gas is changed. Thus, the point defect density A is controlled to fall into the desired state (equal to or less than the target value B, the threshold value).

If, in Step S3, the point defect density A is judged to exceed the value C, the temperature control means is controlled. In Step S5, the temperature within the treating chamber, for example, is adjusted (temperature change) so that the point defect density A is controlled to be in the desired state (equal to or less than the target value B, the threshold value). In Step S5, it is also possible to change the supply amount, supply angle, etc. of the gas in addition.

After the supply status of the raw material gas is changed in Step S4, it is determined in Step S6 whether or not the point defect density A is equal to or less than the target value B (threshold value). That is, it is determined whether or not the point defect density A has been brought into the desired state by changing the supply status of the raw material gas.

If, in Step S6, it is determined that the point defect density A is equal to or less than the target value B, the point defect density is taken to be in the desired state, and the program ends, whereafter the manufacture of the semiconductor wafer 11 is continued as such. Thus, the semiconductor wafer 11 with the desired performance maintained can be manufactured by evaluating the point defect density (e.g., carbon vacancy density) of the semiconductor wafer 11 by means of the evaluation apparatus 21 and controlling the state of the point defect density by the control means 12.

If it is determined in Step S6 that the point defect density A exceeds the target value B, it is judged that the point defect density A has not decreased (the desired point defect density is not obtained) even after changing the supply status of the raw material gas. Thus, the program proceeds to Step S7 to determine that the silicon carbide single crystal manufacturing device 1 is malfunctioning. Then, the program comes to an end.

In other words, if even a change in the supply status of the raw material gas is judged not to attain the desired point defect density (the desired state of defects), the cause of no improvement in the point defect density is judged not to lie in the conditions, but to lie in the silicon carbide single crystal manufacturing device 1 itself. If, in Step S7, the silicon carbide single crystal manufacturing device 1 is judged to have a malfunction, the device is stopped to interrupt the manufacture of the semiconductor wafer 11, and maintenance or the like of the silicon carbide single crystal manufacturing device 1 can be implemented. The maintenance of the silicon carbide single crystal manufacturing device 1 includes, for example, replacement of members constituting the silicon carbide single crystal manufacturing device 1, positional adjustment of the members, and cleaning of the silicon carbide single crystal manufacturing device 1.

According to the above configuration, if the desired performance fails to be achieved even upon control of the point defect density so that the desired performance will be attained, the malfunction of the silicon carbide single crystal manufacturing device 1 itself can be determined, and managemental action on maintenance or the like of the silicon carbide single crystal manufacturing device 1 can be carried out. Hence, the malfunction of the silicon carbide single crystal manufacturing device 1 can be grasped, and it can be avoided to continue manufacturing the semiconductor wafer 11 (product) which does not provide the desired performance.

The so configured semiconductor wafer manufacturing system can maintain the quality of the semiconductor wafer 11 in the desired state, namely, the desired state of point defects (the state where the desired carrier lifetime is obtained). Moreover, the system can control the conditions of the silicon carbide single crystal manufacturing device 1 so as to manufacture the semiconductor wafer 11 in the desired state of point defects, and enables the device 1 to manufacture the semiconductor wafer 11 in a stable state. Furthermore, the system can grasp the malfunction of the silicon carbide single crystal manufacturing device 1, and can prevent the device 1 from continuing the manufacture of the semiconductor wafer 11 (product) which does not provide the desired performance.

Figure 7:
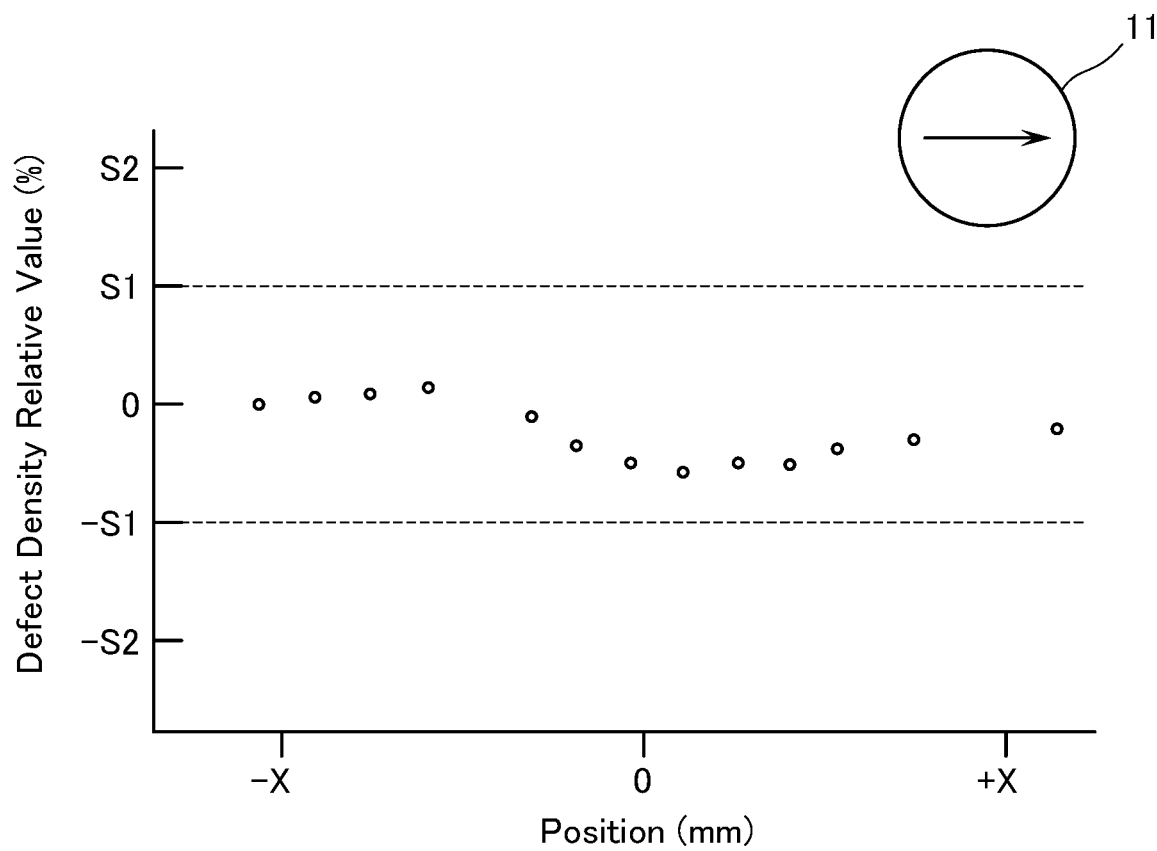
FIG. 7 is a graph showing the in-plane distribution of a point defect density.

As an evaluation indicator of the point defects of the semiconductor wafer, the distribution of the point defect density can be evaluated. FIG. 7 shows the in-plane distribution of the point defect density.

By confirming the density in the plane (in the plane in a transverse direction: indicated by→in the drawing) of the semiconductor wafer 11, the relative values (%) of the density of point defects in the plane of the semiconductor wafer 11 can be evaluated as an example, as shown in FIG. 7. That is, variations in the point defects in the plane of the semiconductor wafer 11 can be evaluated. In the example shown in FIG. 7, the relative values (%) of the density of the point defects in the plane of the semiconductor wafer 11 can be confirmed to fall within the range of ±S1.

In addition to setting the threshold value of the defect density for management of the absolute amount, the variations in the point defects in the plane of the semiconductor wafer 11 are evaluated, whereby the variations in the defect density in the plane of the semiconductor wafer 11 can be managed.

With the above-described evaluation apparatus 21, the point defect density in the plane of the semiconductor wafer 11 is evaluated to determine the malfunction of the silicon carbide single crystal manufacturing device 1. However, it is also possible to evaluate the in-plane distribution of the point defects, thereby determining the malfunction of the silicon carbide single crystal manufacturing device 1. If, in this case, the in-plane variations in the point defects of the semiconductor wafer 11 do not fall within the range of the threshold value, the supply angle of the gas may be adjusted, or a decision on maintenance may be made. By so doing, the in-plane variations in the point defects of the semiconductor wafer 11 can be settled within the range of the threshold value.

The semiconductor wafer evaluation apparatus (evaluation apparatus 21) of the present invention described above brings the contact maker 24 (mercury) into contact with the semiconductor wafer 11 to apply voltage intermittently, and evaluates the state (kinds, density) of point defects based on the status of the electrostatic capacity of the semiconductor wafer 11. In this manner, the metal (mercury) liquefied at room temperature can be used as a Schottky electrode.

Thus, there is no need to cut out the semiconductor wafer 11 partially and stack a metal electrode for the purpose of evaluation. Without this need, the point defects of the entire semiconductor wafer can be evaluated directly. Consequently, semiconductor wafers can be manufactured, with their crystal defects being evaluated easily.

INDUSTRIAL APPLICABILITY

The present invention can be utilized in the industrial fields of semiconductor wafer evaluation apparatuses and semiconductor wafer manufacturing methods.

EXPLANATIONS OF LETTERS OR NUMERALS

1 Silicon carbide single crystal manufacturing device
10 Means for compensating for parasitic inductance and parasitic capacity
11 Semiconductor wafer
12 Control means
21 Evaluation apparatus
22 Table
23 Probe means
24 Contact maker
25 Pulse power supply
26 Capacity meter
27 Evaluation means
29 Photoirradiation means
30 Moving means

The invention claimed is:

1. A semiconductor wafer evaluation apparatus, comprising:
a contact maker where a metal (Schottky electrode) liquefied at room temperature makes contact with a semiconductor wafer as an object to be evaluated;
power supply means for applying a voltage to the contact maker via means for compensating for parasitic inductance and parasitic capacity;
application control means for intermittently establishing an applied state of the voltage from the power supply means; and
evaluation means for evaluating a state of point defects of the semiconductor wafer based on a status of an electrostatic capacity of the semiconductor wafer during intermittent application of the voltage by the application control means,
wherein
the application control means has a function of varying the applied voltage, and
the evaluation means evaluates the state of the point defects at a location deep in a depth direction when the applied voltage is raised.

2. The semiconductor wafer evaluation apparatus according to claim 1, wherein
the metal liquefied at room temperature is mercury.

3. The semiconductor wafer evaluation apparatus according to claim 1, wherein
the point defects are defects whose signals peak at a temperature near room temperature,
the state of the point defects is kinds and a density of the point defects.

4. The semiconductor wafer evaluation apparatus according to claim 1, further comprising:
moving means for moving the contact maker relatively in a range of a diameter of 150 mm or more with respect to a planar direction of the semiconductor wafer.

5. The semiconductor wafer evaluation apparatus according to claim 1, further comprising
photoirradiation means for performing irradiation with light having energy equal to or higher than a bandgap of the semiconductor wafer, and
wherein the evaluation means evaluates the defects by minority carrier transient spectroscopy.

6. The semiconductor wafer evaluation apparatus according to claim 1, wherein
the semiconductor wafer is a SiC single crystal.

7. The semiconductor wafer evaluation apparatus according to claim 6, wherein
the point defects in the SiC single crystal are 2112 centers ascribed to carbon vacancies.

8. A semiconductor wafer manufacturing method, comprising:
adjusting and controlling conditions for film formation by semiconductor manufacturing means based on information on the point defects, which has been obtained using the semiconductor wafer evaluation apparatus according to claim 1, thereby manufacturing a semiconductor wafer.

9. A semiconductor wafer evaluation apparatus, comprising: a contact maker where a metal (Schottky electrode) liquefied at room temperature makes contact with a semiconductor wafer as an object to be evaluated; power supply means for applying a voltage to the contact maker via means for compensating for parasitic inductance and parasitic capacity; application control means for intermittently establishing an applied state of the voltage from the power supply means; evaluation means for evaluating a state of point defects of the semiconductor wafer based on a status of an electrostatic capacity of the semiconductor wafer during intermittent application of the voltage by the application control means; and photoirradiation means for performing irradiation with light having energy equal to or higher than a bandgap of the semiconductor wafer, and wherein the evaluation means evaluates the defects by minority carrier transient spectroscopy.

10. The semiconductor wafer evaluation apparatus according to claim 9, wherein
the metal liquefied at room temperature is mercury.

11. The semiconductor wafer evaluation apparatus according to claim 9, wherein
the point defects are defects whose signals peak at a temperature near room temperature, and
the state of the point defects is kinds and a density of the point defects.

12. The semiconductor wafer evaluation apparatus according to claim 9, further comprising:
moving means for moving the contact maker relatively in a range of a diameter of 150 mm or more with respect to a planar direction of the semiconductor wafer.

13. The semiconductor wafer evaluation apparatus according to claim 9, wherein
the application control means has a function of varying the applied voltage, and
the evaluation means evaluates the state of the point defects at a location deep in a depth direction when the applied voltage is raised.

14. The semiconductor wafer evaluation apparatus according to claim 9, wherein
the semiconductor wafer is a SiC single crystal.

15. The semiconductor wafer evaluation apparatus according to claim 14, wherein
the point defects in the SiC single crystal are 2112 centers ascribed to carbon vacancies.

* * * * *